United States Patent
Marr

[19]

[11] Patent Number: 6,081,464
[45] Date of Patent: *Jun. 27, 2000

[54] CIRCUIT FOR SRAM TEST MODE ISOLATED BITLINE MODULATION

[75] Inventor: Kenneth W. Marr, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/911,498

[22] Filed: Aug. 14, 1997

Related U.S. Application Data

[62] Division of application No. 08/734,064, Oct. 18, 1996, Pat. No. 5,745,415, which is a continuation of application No. 08/421,506, Apr. 12, 1995, Pat. No. 5,568,435.

[51] Int. Cl.[7] ..................................................... G11C 7/00
[52] U.S. Cl. ........................................... 365/201; 365/154
[58] Field of Search ................................... 365/156, 201, 365/154, 226

[56] References Cited

U.S. PATENT DOCUMENTS

| | | | |
|---|---|---|---|
| 4,901,284 | 2/1990 | Ochii et al. ............................... | 365/226 |
| 5,208,777 | 5/1993 | Shibata .................................... | 365/201 |
| 5,212,442 | 5/1993 | O'Toole ................................... | 365/201 |
| 5,222,066 | 6/1993 | Grula et al. ............................. | 371/21.1 |
| 5,255,230 | 10/1993 | Chen et al. ............................. | 365/201 |
| 5,305,267 | 4/1994 | Haraguchi et al. ..................... | 365/201 |
| 5,381,373 | 1/1995 | Ohsawa .................................. | 365/201 |
| 5,644,542 | 7/1997 | McClure et al. ........................ | 365/201 |

*Primary Examiner*—David Nelms
*Attorney, Agent, or Firm*—Trask, Britt & Rossa

[57] ABSTRACT

A circuit and method provide isolated modulation of SRAM bitline voltage levels for improved voltage bump retention testing of the SRAM cells. A first FET is connected to Vcc, bitline load gates of the SRAM cell, and test mode operation control logic. A second FET is connected to the bitline load gates, the test mode logic, and an external pin of the SRAM device. During test mode operation, the first FET disables Vcc to the bitlines, and the second FET enables the internal bitline voltage levels to be modulated by a voltage supply received through the external pin of the device. Modulation of the bitline voltage levels is isolated from normal operating voltage levels of peripheral circuitry such as the wordlines. An alternate embodiment provides a CMOS transmission gate in place of the second FET.

9 Claims, 2 Drawing Sheets

CIRCUIT FOR SRAM TEST MODE ISOLATED BITLINE MODULATION

This is a division of application ser. No. 08/734,064, filed Oct. 18, 1996, U.S. pat. No. 5,745,415; which is a continuation of U.S. Pat. No. 08/421,506, filed Apr. 12,1995 now U.S. Pat. No. 5,568,435.

TECHNICAL FIELD

This invention relates to semiconductor memory technology and, more specifically, to a circuit and method for testing static random access memory (SRAM) using bitline level modulation.

BACKGROUND OF THE INVENTION

SRAM memory arrays use more n-channel (NMOS) field effect transistors (FETs) than conventional dynamic random access memory (DRAM) arrays and are thus capable of storing data without the need to constantly refresh the memory cells as is required in DRAM technology. However, the cross-coupled nature of the SRAM cell allows manufacturing defects to exist within the cell and not necessarily cause the cell to improperly function within the normal operating range when it is first tested, but which may cause it to fail later.

Semiconductor devices in general are commonly subjected to a series of test procedures in order to assure product quality and reliability. Product reliability is a product's ability to function over time within given performance limits under specified operational conditions. These testing procedures conventionally include probe testing, in which an individual die, while still on a wafer, is initially tested to determine functionality and possibly speed. If the wafer has a yield of functional dice which indicates that the quality of the functional dice is likely to be good, each individual die is assembled in a package. Conventionally, the packaging includes mounting the die on a lead frame and encapsulating it in a plastic housing with external leads for electrical connection purposes.

The packaged devices are then subjected to another series of accelerated life testing, which includes burn-in and discrete functional testing. Burn-in detects and weeds out infant mortality failures by exercising the devices and subjecting them to temperature and voltage stresses. Infant mortality refers to those devices that would fail early in their lives due to manufacturing defects. Burn-in accelerates device failure by electrically exercising the devices at elevated temperatures in a burn-in oven adapted for that purpose. Functional testing permits the devices to be tested for speed and for errors which may occur after assembly and after burn-in.

Functional tests can include low and high Vcc margin and bump retention tests. In a bump retention test, for example, voltage is dropped down to a predetermined low level during a read to detect whether the memory device will read correctly or whether it will unacceptably change its memory state. The ability of a cell to retain its data (and not change states) when being read is known as its static noise margin (SNM). Defective cells have a lower SNM than good cells. In other words, the more SNM the cell has, the less likely it is to change states during a read.

Although normal acceptable working voltage levels for a five (5) volt SRAM device may be in the range of 4.5 to 5.5 volts, a bump retention test may drop the voltage down to as low as 2.2 volts to test the extreme functional limits of the device. If the device retains its data and reads properly during the low voltage test state, it is deemed a function device. On the other hand, if a memory cell (or cells) in the device unacceptably changes states, the device fails the test and is discarded.

Alternatively, instead of using a predetermined low voltage, a more complete voltage search test may be performed wherein various low voltage levels are applied incrementally to determine what the functional voltage limits of the array of cells are. This test is often used to determine a point of full array failure, meaning the voltage level at which most, if not all, of the cells unacceptably change states. However, this test is time consuming and costly and so is performed only when deemed cost effective.

Bump retention tests can be performed either at wafer sort or in packaged part testing. Although this type of testing screens out most defective SRAM cells, it retains certain inherent limitations. For example, it is known that some defective cells are not detected during a low voltage bump retention read test due to, possibly, the reaction of peripheral circuitry characteristics in the SRAM device during the low voltage portion of the test. Essentially, when extreme low or high voltages are applied to an SRAM device for specific test purposes, all circuitry in the device is subject to the same test voltage level without any isolating effects for peripheral circuitry. The problem associated with all circuitry being subject to the same test voltage level is that certain peripheral circuitry (for example, wordlines) should selectively retain a normal acceptable voltage level (different from the test voltage level) for improved testing conditions and to better isolate defective aspects of the cells.

Accordingly, objects of the present invention are to provide a circuit and method for isolating test voltages for improved functional testing of SRAM devices.

SUMMARY OF THE INVENTION

According to principles of the present invention in its preferred embodiment, a test mode circuit and method provide for isolated, external modulation of SRAM bitline levels for improved voltage bump retention testing of the SRAM cells. A first FET is connected to Vcc, bitline load gates of the SRAM cell, and test mode control logic. A second FET is connected to the bitline load gates, the test mode logic, and an external pin of the SRAM device. During test mode operation, the first FET disables Vcc to the bitline load gates, and the second FET enables a voltage received from the external pin to be applied to the bitline load gates to modulate bitline voltage levels while retaining a normal operating voltage level applied to peripheral circuitry of the SRAM.

According to further principles of the present invention, an alternate embodiment provides a CMOS transmission gate in place of the second FET, and the test mode control logic is modified accordingly.

Advantages of the present invention are that it provides an improved means for detecting the low voltage level of a full array failure for a more reliable screen of defective SRAM devices. A further advantage includes faster low voltage read testing cycle time since the periphery wordline supply voltage is isolated from the externally modulated bitline voltage while in test mode.

Other objects, advantages, and capabilities of the present invention will become more apparent as the description proceeds.

DETAILED DESCRIPTION OF THE INVENTION

Figure 1:
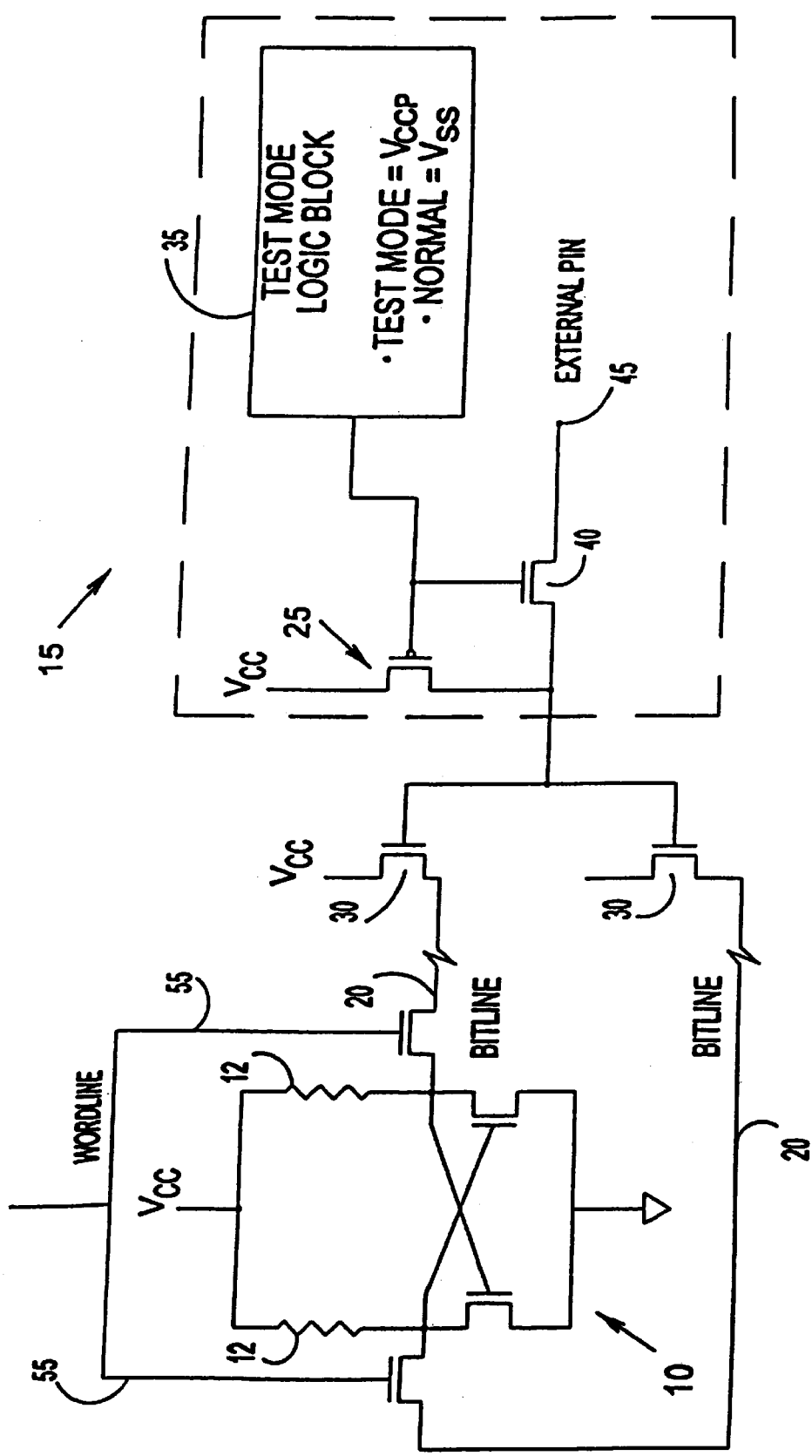
FIG. 1 is a schematic of the present invention circuit connected to a conventional SRAM cell for external modulation of internal bitlines during test mode of the cell.

FIG. 1 is a schematic of the present invention circuit 15 connected to a conventional SRAM cell 10 for external modulation of internal bitlines 20 during test mode of the cell. Although SRAM cell 10 is shown having resistor loads 12, the present invention is equally applicable to all SRAM cell architectures, such as those having a p-channel load or a thin film transistor (TFT) load, for example. Furthermore, where electrical functions and connections are described in this disclosure, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is, therefore, intended to include components which are in electrical communication despite intervening components.

In the preferred embodiment, one active area of p-channel FET 25 is connected to bitline load gates 30, and the other active area is connected to Vcc. The gate of FET 25 is connected to test mode control logic circuitry or block 35. Similarly, the gate of n-channel FET 40 is connected to test mode logic circuitry 35, and one active area of n-channel FET 40 is connected to bitline load gates 30. However, the other active area of FET 40 is connected to an external pin 45 (terminal or bonding pad) of the device, rather than to Vcc, for providing external voltage modulation through FET 40 to bitline load gates 30.

Test mode control logic circuitry 35 provides a test mode operation control signal (bitline isolation mode control signal) for SRAM cell 10. Specifically, during normal operation of SRAM cell 10, test mode logic block 35 sends a normal operation control ground signal Vss to the gate of p-channel FET 25 to retain FET 25 in an "ON" state thereby allowing Vcc to pass through FET 25 and operate bitline load gates 30. Also during this normal operating state, the gate of n-channel FET 40 likewise receives the Vss signal but is retained in an "OFF" state to disallow any externally applied voltage at terminal 45 to pass through FET 40. In this normal operating condition, the voltage levels for bitlines 20 are calculated as Vcc−Vt where Vt is the threshold voltage of bitline load gates 30. FETs 25 and 40 are referred to as enabling circuitry for selectively enabling a voltage signal to the bitline load gates 30.

In contrast, during test mode operation, logic block 35 sends a test mode (isolation) operation control signal Vccp to FETs 25 and 40. Vccp is some voltage signal greater than Vcc which may be produced by Vcc pump logic circuitry contained on the SRAM device, or may be passed in through an external pin. The manner in which test mode logic circuitry 35 is implemented or enabled is not particularly germane to this invention except that it must produce signals to operate FETs 25 and 40 so that external modulation of bitlines 20 occurs from external pin 45.

When test mode circuitry logic 35 sends the Vccp signal, p-channel FET 25 is turned "OFF" to disable the Vcc voltage to bitline load gates 30, and n-channel FET 40 is turned "ON" to enable an external test voltage (Ve) applied at terminal 45 to pass through FET 40 to bitline load gates 30. In this test mode condition, the voltage levels for bitlines 30 are calculated as Ve−Vt. As the bitline levels drop in response to the reduced test voltage Ve, the SNM of cell 10 decreases and allows for detection of a defective cell. However, the present invention isolates this drop in bitline levels from the peripheral circuitry of cell 10 for improved SRAM testing. Namely, although Ve (a second voltage signal relative to a first voltage. signal Vcc) is applied at terminal 45 and at the bitline load gates 30 (first circuitry) to modulate bitlines 20, the Vcc signal remains selectively connected to second (peripheral) circuitry such as the active areas of bitline load gates 30, pull up resistor loads 12, and wordlines 55. In this context, Ve is isolated (as applied to load gates 30 for bitlines 20) relative to Vcc (as applied to the peripheral circuitry).

The advantages of the present invention in isolating the bitline voltage level from the peripheral circuitry voltage level is that (1) it allows a lower test voltage to be applied to the bitlines while retaining completely functional peripheral circuitry for reliable test conditions; (2) the point of full array failure is better detected because a lower voltage search limit can be applied to the bitlines while retaining functionally isolated wordlines; and (3) testing occurs at a much faster cycle time (cell addressing) because the periphery (wordline) supply voltage is isolated from the bitline voltage.

Figure 2:
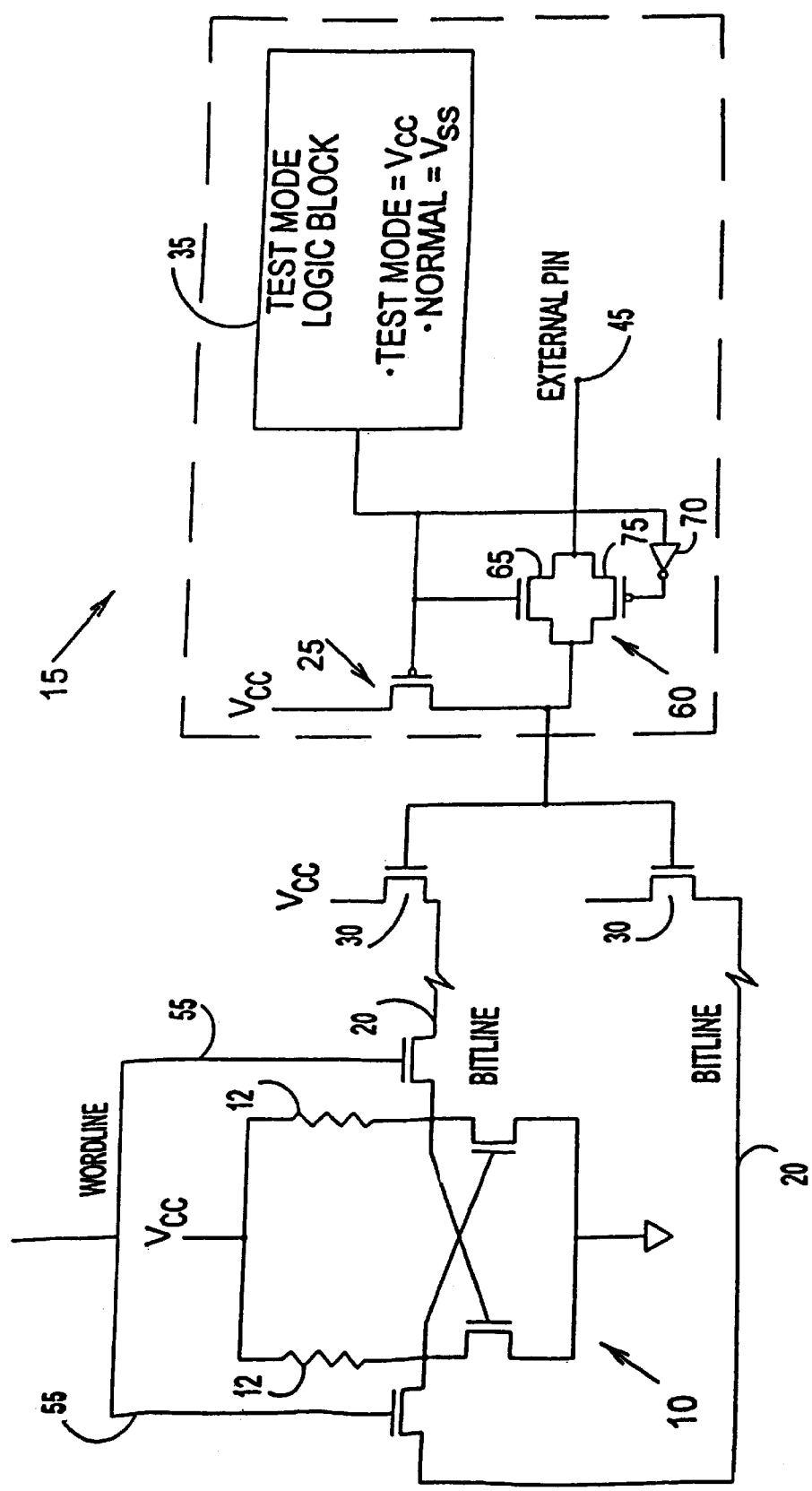
FIG. 2 is an alternate embodiment of the present invention.

Referring now to FIG. 2, an alternate embodiment of the present invention is shown. Although the general principle of externally modulating bitlines 20 remains the same, this embodiment provides some noted distinctions. Particularly, a complementary metal oxide semiconductor (CMOS) transmission gate 60 is used instead of an NMOS pass gate (FET 40 of FIG. 1), and logic block 35 sends a Vcc test mode signal rather than a Vccp signal. The gate of n-channel device 65 of CMOS transmisson gate 60 is connected to logic block 35. Furthermore, inverter 70 is connected between logic block 35 and the gate of p-channel device 75 of CMOS gate 60.

This embodiment provides an advantage in that no voltage pump is required to produce a Vccp signal (as in FIG. 1); thus less die space is used. However, this embodiment cannot be used on, for example, a 3.3 volt part that has 5 volt compatible Input/Outputs due to the issue of forward-bias of the p+ nwell diode on p-channel device 75 of CMOS transmission gate 60.

The resulting function of this embodiment is similar to that of FIG. 1. Namely, during normal operation of SRAM cell 10, test mode logic block 35 sends a ground signal Vss to the gate of p-channel FET 25 to retain FET 25 in an "ON" state, thereby enabling Vcc to pass through FET 25 and operate bitline load gates 30. The gate of n-channel device 65 also receives the Vss control mode signal, and the gate of p-channel device 75 receives an inverted signal through inverter 70 so that CMOS transmission gate 60 is retained in an "OFF" state to disable the pass through of any externally applied voltage at terminal 45.

During test mode operation, logic block 35 sends a test mode signal Vcc (not Vccp) to FET 25 and n-channel device 65, and FET 75 receives an inverted Vcc signal. When test mode logic 35 sends the Vcc signal, pchannel FET 25 is turned "OFF" to disable the Vcc voltage to bitline load gates 30, and n-channel device 65 and FET device 75 are turned "ON" to allow an external test voltage (Ve) applied at terminal 45 to pass through CMOS gate 60 to bitline load gates 30. As the bitline voltage levels drop in response to the reduced test voltage Ve, the SNM of cell 10 decreases. However, since the bitline voltage level drop is isolated from the Vcc selectively applied to the peripheral circuitry of cell 10, such as at wordlines 55, read testing for a defective cell is enhanced.

What has been described above are the preferred embodiments for a circuit and method to provide isolation and external modulation of bitline levels for improved voltage bump retention testing of SRAM cells. It is clear that the present invention provides a powerful tool for improving SRAM device testing and reliability. While the present invention has been described by reference to specific embodiments, it will be apparent that other alternative embodiments and methods of implementation or modification may be employed without departing from the true spirit and scope of the invention.

What is claimed is:

1. An apparatus for controlling bitline voltages in a semiconductor memory device, the apparatus comprising switching circuitry having a control terminal for receiving a test mode enable signal and at least one bitline terminal for selectively outputting a normal bitline voltage to at least one bitline in the memory device in response to the control terminal receiving an inactive test mode enable signal and for selectively outputting an analog test mode bitline voltage different than the normal bitline voltage to the at least one bitline in the memory device in response to the control terminal receiving an active test mode enable signal.

2. The apparatus of claim 1 wherein the switching circuitry comprises:

a supply voltage switching circuit coupled to the control terminal for receiving the test mode enable signal and having an output terminal for selectively outputting a supply voltage in response to the test mode enable signal being inactive;

a test mode voltage switching circuit also coupled to the control terminal for receiving the test mode enable signal and having an output terminal for selectively outputting an analog test mode voltage different than the supply voltage in response to the test mode enable signal being active; and a bitline switching circuit coupled to the output terminals of the supply voltage and test mode voltage switching circuits and to the at least one bitline terminal for selectively outputting the normal bitline voltage and the analog test mode bitline voltage to the at least one bitline in the memory device in response to the respective supply voltage and test mode voltage switching circuits outputting the respective supply and analog test mode voltages.

3. The apparatus of claim 2 wherein the supply voltage switching circuit comprises a PMOS transistor.

4. The apparatus of claim 2 wherein the test mode voltage switching circuit is selected from a group comprising an NMOS transistor and a CMOS transmission gate.

5. The apparatus of claim 2 wherein the bitline switching circuit comprises at least one NMOS bitline load transistor.

6. The apparatus of claim 2 further comprising a pin external to the memory device coupled to the test mode voltage switching circuit for providing the analog test mode voltage thereto.

7. The apparatus of claim 1 further comprising a test mode logic block in the memory device coupled to the control terminal for providing the test mode enable signal thereto.

8. A Static Random Access Memory (SRAM) integrated circuit device comprising:

a plurality of SRAM memory cells;

a plurality of bitlines coupled to the SRAM memory cells;

a pin for receiving an analog test mode voltage from circuitry external to the SRAM device;

a test mode logic block for outputting an inactive test mode enable signal in a normal mode of the device and an active test mode enable signal in a test mode of the device;

a supply voltage switching circuit coupled to the test mode logic block for selectively outputting a supply voltage different than the analog test mode voltage in response to the test mode enable signal being inactive;

a test mode voltage switching circuit coupled to the test mode logic block and the package pin for selectively outputting the analog test mode voltage in response to the test mode enable signal being active; and a bitline switching circuit coupled to the supply voltage and test mode voltage switching circuits and to the bitlines for selectively outputting a normal bitline voltage to the bitlines in response to the supply voltage switching circuit outputting the supply voltage and for selectively outputting a test mode bitline voltage to the bitlines in response to the test mode voltage switching circuit outputting the analog test mode voltage.

9. A semiconductor wafer comprising a plurality of integrated circuit memory devices, each memory device comprising:

a plurality of memory cells;

a plurality of bitlines coupled to the memory cells; and switching circuitry having a control terminal for receiving a test mode enable signal and a plurality of bitline terminals coupled to the bitlines for selectively outputting a normal bitline voltage thereto in response to the control terminal receiving an inactive test mode enable signal and for selectively outputting an analog test mode bitline voltage different than the normal bitline voltage to the bitlines in response to the control terminal receiving an active test mode enable signal.

* * * * *

UNITED STATES PATENT AND TRADEMARK OFFICE
CERTIFICATE OF CORRECTION

PATENT NO. : 6,081,464
DATED : June 27, 2000
INVENTOR(S) : Kenneth W. Marr

It is certified that error appears in the above-identified patent and that said Letters Patent is hereby corrected as shown below:

Column 3,
Line 40, after "state" insert a comma -- , --

Column 4,
Line 57, change "pchannel" to -- p-channel --
Line 59, after "FET" delete "device"

Column 6,
Line 23, after "and the" delete "package"

Signed and Sealed this

Twenty-first Day of September, 2004

JON W. DUDAS
*Director of the United States Patent and Trademark Office*